US008411399B2

(12) United States Patent
Venkatraman et al.

(10) Patent No.: US 8,411,399 B2
(45) Date of Patent: Apr. 2, 2013

(54) DEFECTIVITY-IMMUNE TECHNIQUE OF IMPLEMENTING MIM-BASED DECOUPLING CAPACITORS

(75) Inventors: Ramnath Venkatraman, San Jose, CA (US); Ruggero Castagnetti, Menlo Park, CA (US)

(73) Assignee: LSI Corporation, Milpitas, CA (US)

( * ) Notice: Subject to any disclaimer, the term of this patent is extended or adjusted under 35 U.S.C. 154(b) by 275 days.

(21) Appl. No.: 12/839,148

(22) Filed: Jul. 19, 2010

(65) Prior Publication Data
US 2011/0051304 A1 Mar. 3, 2011

Related U.S. Application Data

(60) Provisional application No. 61/275,554, filed on Aug. 31, 2009.

(51) Int. Cl.
*H02H 3/22* (2006.01)
(52) U.S. Cl. .......................... 361/56; 361/111
(58) Field of Classification Search ............ 361/56, 361/93.9, 111
See application file for complete search history.

(56) References Cited

U.S. PATENT DOCUMENTS

| 5,770,969 | A  | 6/1998  | Walls et al. |
| 6,124,625 | A  | 9/2000  | Chern et al. |
| 6,720,232 | B1 | 4/2004  | Tu et al. |
| 6,849,387 | B2 | 2/2005  | Chiang et al. |
| 6,919,233 | B2 | 7/2005  | Papa Rao et al. |
| 6,967,416 | B2 | 11/2005 | Clevenger et al. |
| 7,176,552 | B2 | 2/2007  | Park et al. |
| 7,495,878 | B2 | 2/2009  | Todd |
| 7,508,696 | B2 | 3/2009  | Komaki |
| 7,557,399 | B2 | 7/2009  | Tu et al. |
| 8,009,398 | B2 * | 8/2011 | Agarwal et al. ............... 361/56 |
| 2008/0232019 | A1 * | 9/2008 | Todd ........................... 361/111 |
| 2009/0096516 | A1  | 4/2009 | Nakashima |
| 2010/0148304 | A1 * | 6/2010 | Rahim et al. ................. 257/532 |

OTHER PUBLICATIONS

Chen, H.C. et al., On-Chip Decoupling Capacitor Optimization for High-Performance VLSI Design; (IBM), 1995 Intl Symp. VLSI Technology; pp. 99-103 (downloaded Jan. 15, 2010 from IEEE).
Sanchez, H, et al.; "Increasing Microprocessor Speed by Massive Application of On-Die High-K MIM Decoupling Capacitors", 2006 IEEE international Solid-State Circuits Conference; ISSCC 2006/Session 29/Power Management and Distribution/29.3; 10 pages. (downloaded Jan. 15, 2010 from IEEE).
Kim, Sun-Jung, et al.; Metal-Insulator-Metal RF Bypass Capacitor Using Niobium Oxide (Nb205) With Hf02/A1203 Barriers; IEEE Electron Device Letters, vol. 26, No. 9, Sep. 2005, pp. 625.
Popovich, Mikhail, et al.; "Efficient Distributed On-Chip Deccupling Capacitors for Nanoscale ICs"; IEEE Transactions on Very Large Scale Integration (VLSI) Systems, vol. 16, No. 12, Dec. 2008; pp. 1717-1721.
Roberts, D., et al.; "Application of On-Chip MIM Decoupling Capacitor for 90 nm SOI :Microprocessor"; 2005 IEEE, pp. 4. (downloaded Jan. 15, 2010 from IEEE).

* cited by examiner

*Primary Examiner* — Danny Nguyen

(57) ABSTRACT

An integrated circuit power supply decoupling circuit includes a capacitor and a protection circuit. The capacitor has a first terminal and a second terminal. The protection circuit includes a first transistor having a first conduction path, and a second transistor having a second conduction path. One terminal of the first conduction path is connected to the first terminal of the capacitor, and another terminal of the first conduction path is connected to a first power supply rail. One terminal of the second conduction path is connected to the second terminal of the capacitor, and another terminal of the second conduction path is connected to a second power supply rail.

20 Claims, 7 Drawing Sheets

DEFECTIVITY-IMMUNE TECHNIQUE OF IMPLEMENTING MIM-BASED DECOUPLING CAPACITORS

CROSS-REFERENCE TO RELATED APPLICATION

This application claims the benefit of U.S. Provisional Application Ser. No. 61/275,554, filed by Ramnath Venkatraman, et al. on Aug. 31, 2009 entitled "Defectivity-Immune Technique of Implementing MIM-Based Decoupling Capacitors", commonly assigned with this application and incorporated herein by reference.

TECHNICAL FIELD

This application is directed, in general, to electronic devices, and, more specifically, to power supply decoupling.

BACKGROUND

Decoupling capacitors (DECAPs) are commonly incorporated into system-on-a-chip (SoC) designs to mitigate switching noise caused by changes in current flowing through various parasitic inductances associated with the chip and a package in which the chip is located. Simultaneous switching of the input/output (I/O) and core circuits within the chip can cause a voltage droop on the power supply source by an amount approximated by $\Delta V = L(di/dt)$ where L is the effective wire inductance of the power bus (including that on the package), and di/dt is the instantaneous rate of increase of current over time. This "power supply noise" not only may increase signal delay, thereby reducing the operating frequency of the SoC, but in some cases may inadvertently cause state transitions in logic circuits within the SoC.

Some decoupling capacitors are typically placed on a circuit board upon which the SoC is placed. Such capacitors are generally effective in mitigating supply noise at relatively low frequencies. However, at higher frequencies, these capacitors are typically not as effective, so it is generally desirable to integrate on-chip decoupling capacitors into the SoC design.

In an application-specific integrated circuit (ASIC) design flow, standard-cell logic may be placed into the design using an automated design tool "place-and-route" step. After placement of the standard-cell logic, DECAPs are commonly added into the fabric of the standard-cell logic after the place-and-route step by placing the DECAPs opportunistically in area, e.g., "white space", that is unoccupied by active logic cells. Such a "filler" methodology minimizes or eliminates any additional area overhead required for placement of these DECAP cells, which are designed to be consistent with the design rules of the CMOS technology of relevance.

In most cases, the available space for the DECAP cells after routing the functional circuit is sufficient to meet the voltage-noise requirements of the SoC design. However, in some cases, the switching activity on the chip can be very high, thus proportionately increasing the amount of on-chip decoupling capacitance needed. The capacitance requirements can be high enough that the amount of available white space on the chip is insufficient to meet the voltage noise specifications. In such cases, specialized forms of decoupling capacitors may need to be introduced.

An example of a specialized decoupling capacitor is the Metal-Insulator-Metal ("MiM") capacitor. MiM capacitors may be formed on the chip and may provide a greater unit capacitance ($\mu F/\mu m^2$, e.g.) than gate-oxide based capacitors. MiM capacitors have been demonstrated to offer significant advantages in enhancing the performance of high-performance circuits. Multiple types of MiM capacitors have been reported in the literature. In one example, a MiM can be formed using parallel electrodes at least partially in a metal interconnect level of the SoC. In another example, a capacitor dielectric is incorporated within a feature etched into a dielectric that is located between CMOS transistors and the first level of metallization level, e.g., metal 1. The latter example is typically used in the manufacturing of embedded dynamic RAM (DRAM). Common to both implementations is a small but non-negligible rate of defects that lead to low-resistance connection between the capacitor electrodes. Such defects can reduce device yield and/or reliability.

SUMMARY

One aspect provides an integrated circuit power supply decoupling circuit that includes a capacitor and a protection circuit. The capacitor has a first terminal and a second terminal. The protection circuit includes a first transistor having a first conduction path, and a second transistor having a second conduction path. One terminal of the first conduction path is connected to the first terminal of the capacitor, and another terminal of the first conduction path is connected to a first power supply rail. One terminal of the second conduction path is connected to the second terminal of the capacitor, and another terminal of the second conduction path is connected to a different second power supply rail.

Another aspect provides an integrated circuit, including a device substrate and active circuitry located over the substrate. The active circuitry is configured to be powered by a first power supply rail and a second power supply rail. A capacitor having a first terminal and a second terminal is configured to reduce power supply noise on the first and second power supply rails. A protection circuit is configured to limit a current through the capacitor. The protection circuit includes a first transistor having a first conduction path and a second transistor having a second conduction path. One terminal of the first conduction path is connected to the first terminal, and another terminal of the first conduction path is connected to the first power supply rail. One terminal of the second conduction path is connected to the second terminal, and another terminal of the second conduction path being connected to the second power supply rail.

Yet another aspect provides a method of manufacturing an integrated circuit. The method includes providing a substrate and forming active circuitry thereover. The active circuitry is configured to be powered by a first power supply rail and a second power supply rail. A decoupling capacitor located over the substrate is configured to reduce power supply noise on the first and second power supply rails. A protection circuit is located over the substrate to limit a current through the capacitor. The protection circuit includes a first transistor having a first conduction path and a second transistor having a second conduction path. One terminal of the first conduction path is connected to the first terminal, and another terminal of the first conduction path is connected to the first power supply rail. One terminal of the second conduction path is connected to the second terminal, and another terminal of the second conduction path being connected to the second power supply rail.

BRIEF DESCRIPTION

Reference is now made to the following descriptions taken in conjunction with the accompanying drawings, in which like numbers refer to like elements, in which:

FIG. 1 presents an electronic device of the disclosure, illustratively an integrated circuit (IC) die, including multiple placements of power supply decoupling circuits including a protection circuit;

Figure 1:
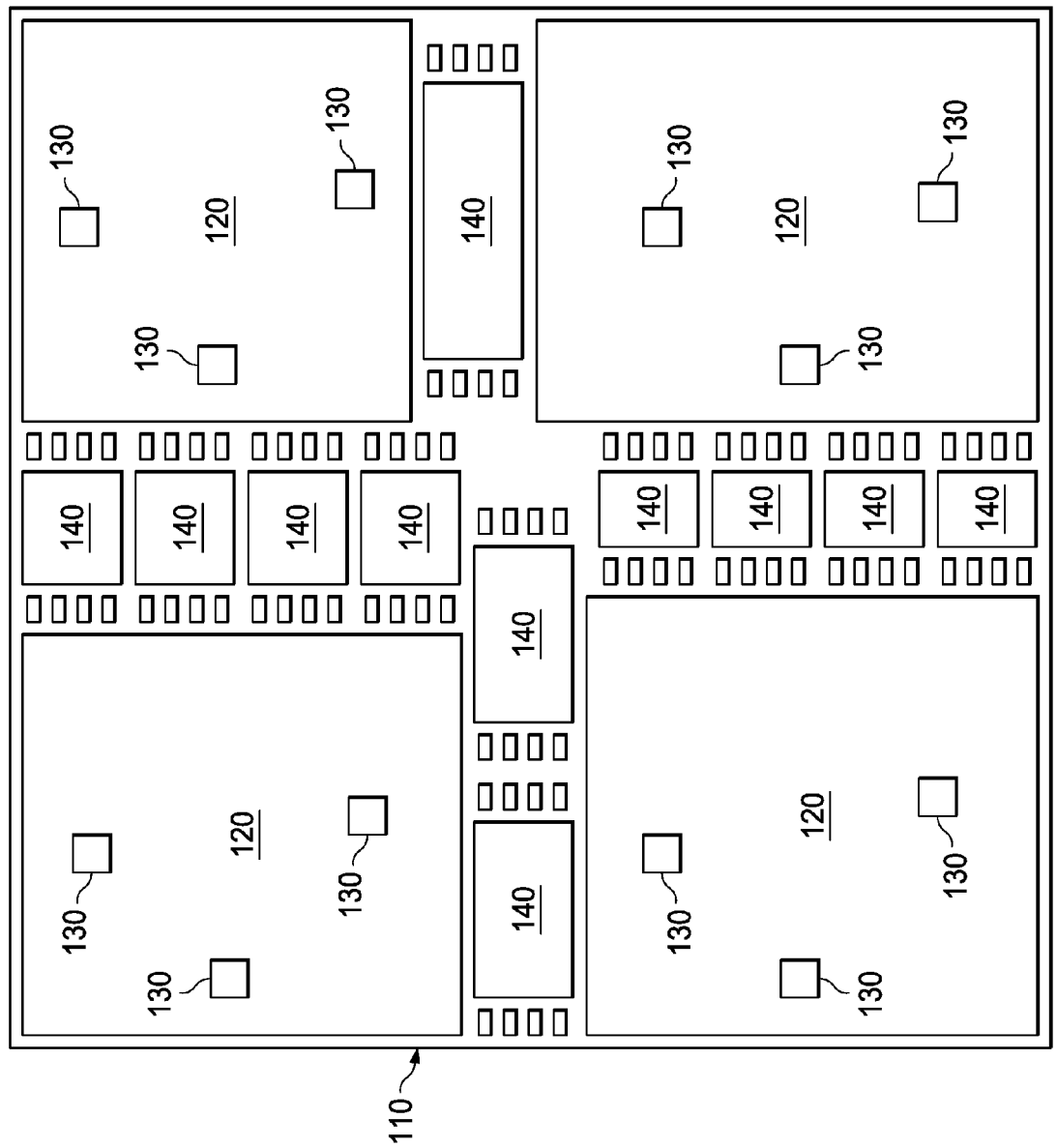
Figure 2:
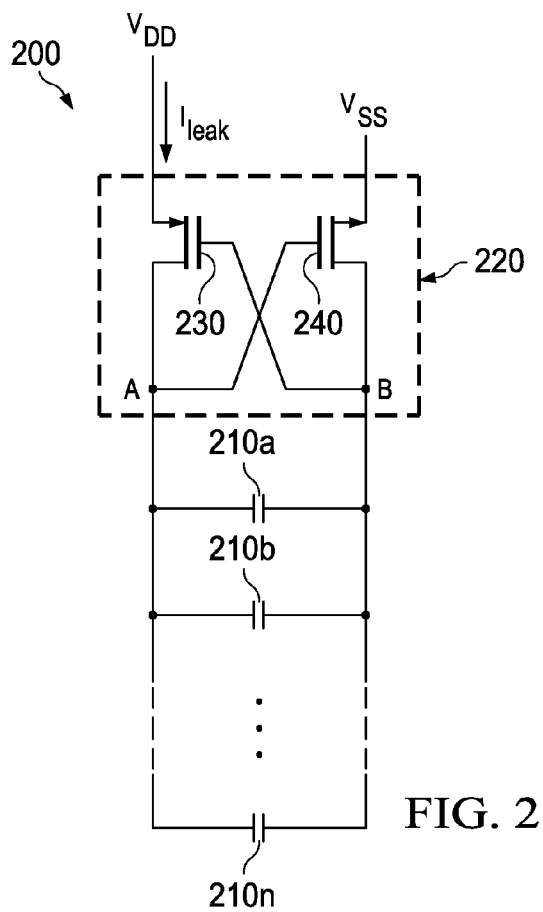
FIG. 2 illustrates a capacitor bank and protection circuit of the disclosure, e.g. such as included in the decoupling circuits of FIG. 1.
Figure 9:
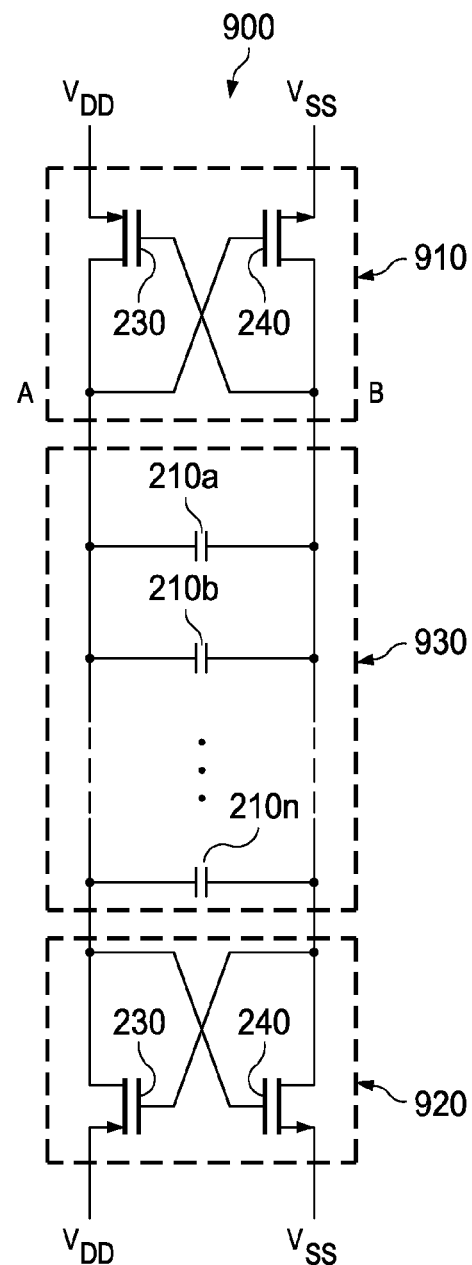
Figure 7:
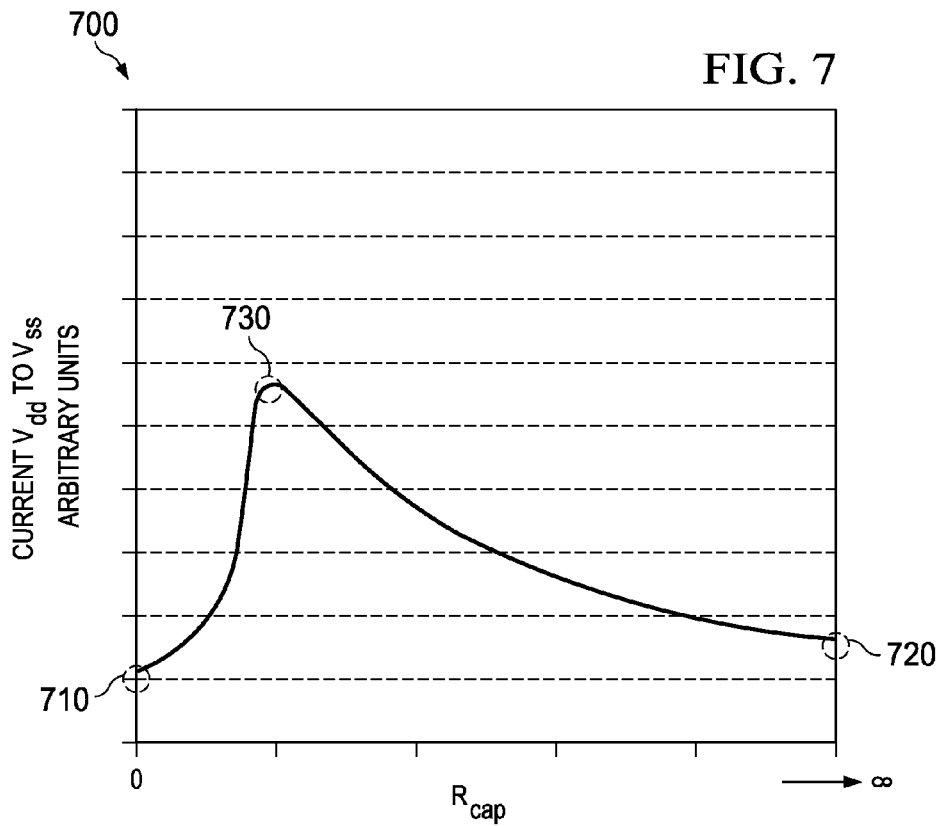
Figure 8:
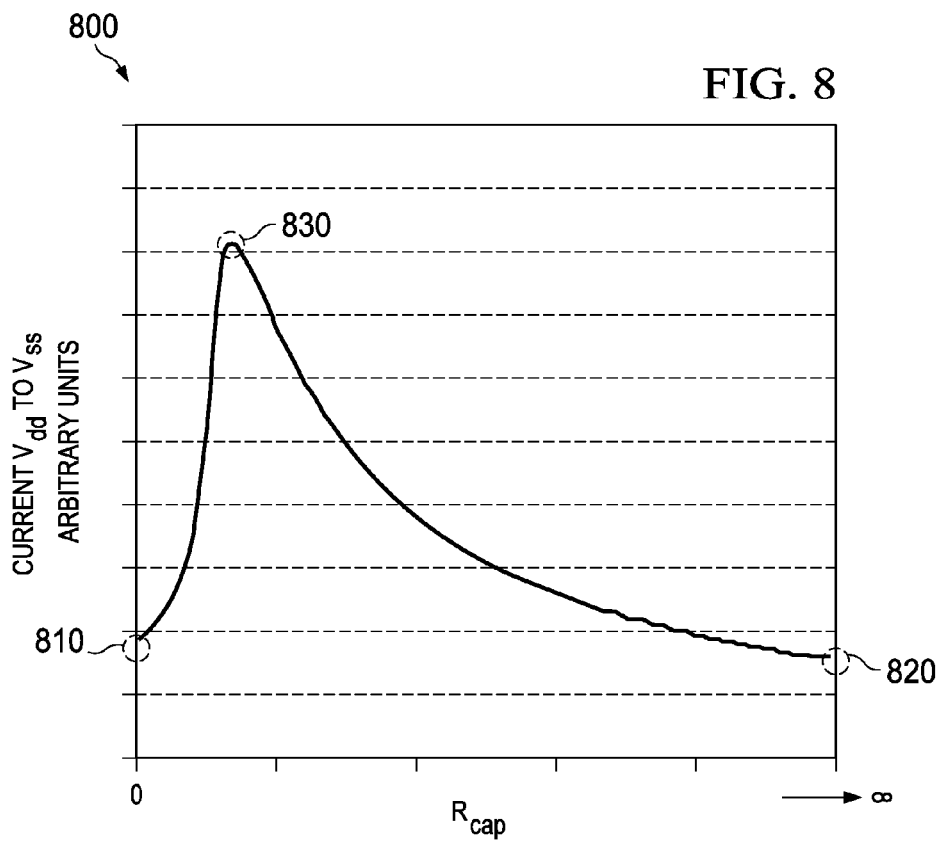
Figure 10A:
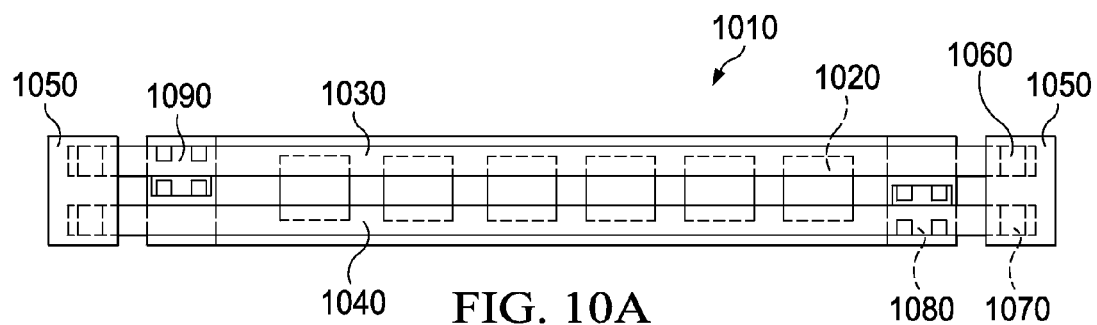
Figure 10B:
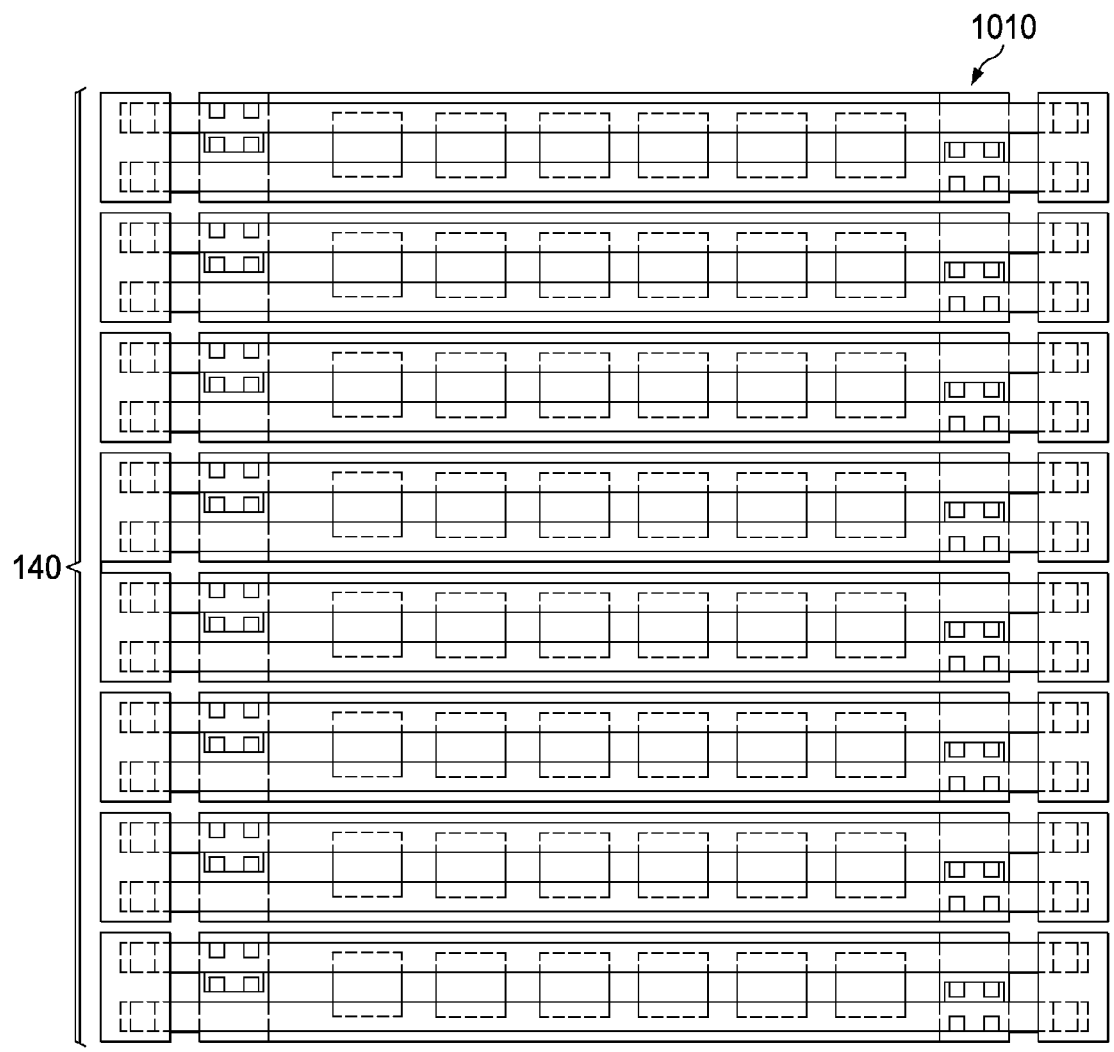
Figure 11:
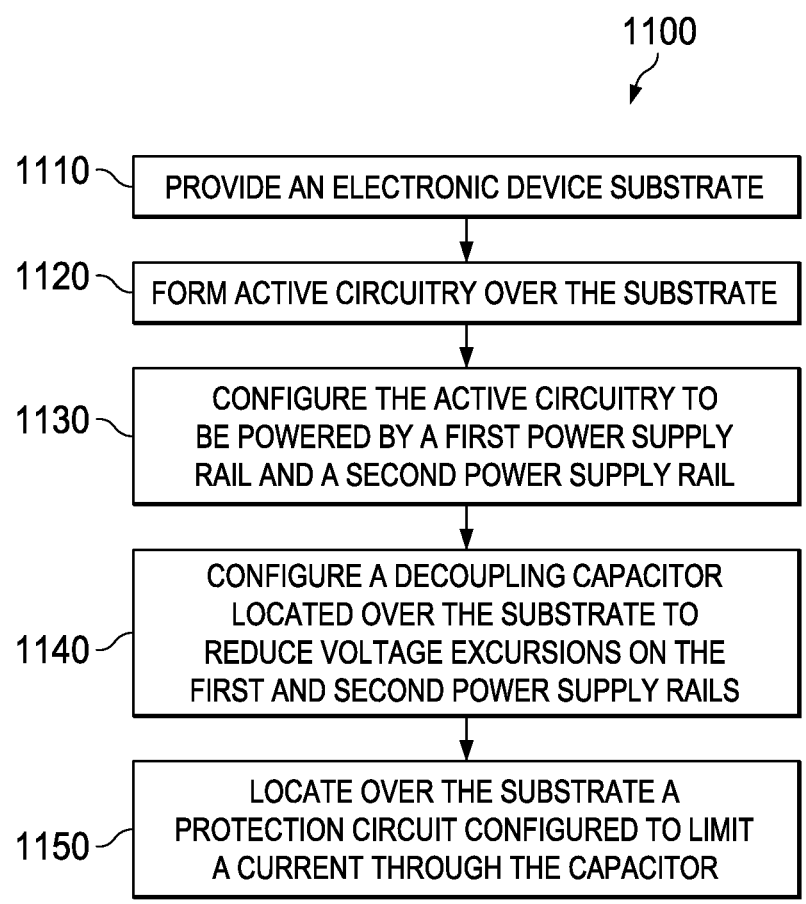

FIGS. 7 and 8 present illustrative current-resistance characteristics of, e.g. the protection circuit of FIG. 2;

FIG. 9 presents an illustrative embodiment of a decoupling circuit, such as illustrated in FIG. 1, including two protection circuits and an array of decoupling capacitors;

FIG. 10A illustrates an illustrative embodiment of a physical layout of a decoupling capacitor array;

FIG. 10B illustrates an illustrative embodiment of a decoupling circuit including multiple placements of the capacitor array and protection circuits illustrated in FIG. 10A; and FIG. 11 illustrates a method of the disclosure for manufacturing an electronic device, e.g. the IC die of FIG. 1.

DETAILED DESCRIPTION

The defectivity rate of DECAP cells at the transistor level, using the gate dielectric level as the capacitor dielectric, is relatively low. This is because such decoupling capacitors are manufactured with the same processes as those used for the standard CMOS transistors, including a high quality gate dielectric level. Thus, yield loss and/or current leakage for designs using such DECAPs is relatively low.

However, interconnect levels used to form MiM-based DECAPs are typically more susceptible to processing defects that may result in low-resistance paths, sometimes referred to herein as a short, between MiM DECAP electrodes. These defects may reduce the overall yield as well as the reliability of the product using the MiM DECAPs. A short through the MiM capacitor may lead to a high current between the current supply node and the ground node, thus jeopardizing the functionality of the entire device.

The present disclosure introduces a simple and innovative protection scheme for decoupling capacitors that advantageously significantly reduces the risk of yield loss from shorted DECAPs. While embodiments described herein may be practiced with any on-chip decoupling capacitor, practice thereof with MiM DECAPs may be particularly advantageous due to the higher defectivity of MiM capacitors relative to other available capacitor types. Embodiments of the disclosure may make possible the use of MiM DECAPs in electronic devices, e.g., integrated circuits, that would not otherwise be suitable for such MiM capacitors due to reliability concerns.

Various embodiments described herein include a small CMOS-compatible protection circuit used with one or more MiM capacitors. The protection circuit reduces or eliminates the risk of the above-mentioned defectivity while still largely maintaining the decoupling efficiency of the capacitor.

One advantage of various embodiments described herein includes providing design robustness against potential defects that could otherwise impact the overall yield and reliability of an electronic device, while still providing power supply decoupling. Another advantage is that various embodiments described herein do not require any special processes or special design tools over what would be needed to fabricate decoupling capacitors.

FIG. 1 illustrates an electronic device 100 according to the disclosure. The device 100 is illustratively an integrated circuit. The device 100 includes a device substrate 110 upon which active circuitry 120 is located. The substrate 110 may be any substrate suitable for manufacturing an electronic device, such as, without limitation, a semiconductor wafer. A semiconductor wafer may include, e.g., silicon, germanium, GaAs, semiconductor-on-insulator, epitaxial layers, and polycrystalline materials. In some embodiments the substrate may include an organic film on which organic electronic devices such as organic FETs (oFETs) and organic LEDs (oLEDs) are formed.

Active circuitry means any combination of electronic elements such as FETs, bipolar transistors, resistors, capacitors, inductors and the like that are configured to operate with power provided by at least two polarities of a voltage source, e.g., $V_{dd}$ and $V_{ss}$. The active circuitry need not be actually powered to be regarded as active, and need not be completely interconnected in its final configuration to be considered active circuitry.

The active circuitry 120 is powered by one or more power supply rails that conduct power from a power source to various elements of the active circuitry 120. Without limitation, a power rail of one polarity may be referred to herein as $V_{dd}$ while a power rail of another polarity may be referred to as $V_{ss}$. In a nonlimiting example, $V_{dd}$ may be a positive voltage, and $V_{ss}$ may be ground.

The device 100 includes a number of power supply decoupling circuits. Embedded decoupling circuits 130, e.g. capacitors, are located within areas of the device 100 used for the active circuitry 120. Consolidated decoupling circuits 140 are located within areas of the device 100 that are outside blocks containing active circuitry, e.g., so-called "white space" in the design layout of the device 100.

Turning to FIG. 2, illustrated is an embodiment of a power supply decoupling circuit 200. The decoupling circuit 200 includes one or more capacitors 210a, 210b, . . . , 210n, collectively referred to as decoupling capacitors 210, and referred to in the singular as a decoupling capacitor 210 when further distinction is unnecessary. The decoupling capacitors 210 may include any type of capacitor that may be formed by a process flow used to form the device 100. Such capacitor types include MiM capacitors, gate dielectric capacitors, and DRAM cell storage capacitors. Without limitation, various embodiments are described by reference to MiM capacitors, while recognizing that those skilled in the pertinent art may apply the principles of the embodiments to other capacitor types.

The decoupling capacitors 210 are connected to a protection circuit 220 via a node A and a node B. Herein, the term "connected" refers to conductive coupling unless stated otherwise. Conductive coupling may be by way of conductive traces such as metal or polysilicon interconnects, and may include interlevel connections ("vias") where appropriate to a particular design. Metal interconnects may be, e.g., copper or aluminum lines.

The protection circuit 220 is connected to a $V_{dd}$ voltage rail and a $V_{ss}$ voltage rail. The decoupling capacitors 210 are configured to reduce power supply noise, e.g., transient voltage excursions from a desired voltage level having a duration of 10 ns or less, on the $V_{dd}$ and $V_{ss}$ rails. The decoupling capacitor 210 has an impedance that in general is complex and includes a resistive component. The resistive component may include current through the decoupling capacitor 210 from all sources, including loss mechanisms, dielectric leakage and shorting between plates of the decoupling capacitor 210. Typically, with the exception of a short, the current through the decoupling capacitor 210 may be neglected. However, when a short between the plates of the decoupling capacitor 210 allows excessive current to flow between the $V_{dd}$ and $V_{ss}$ rails, the short may cause the device 100 to fail or use excessive power.

The protection circuit 220 is configured to limit a current $I_{leak}$ between the $V_{dd}$ rail and the $V_{ss}$ rail through the decoupling capacitor 210. Thus, when the decoupling capacitor 210 has a low resistance due to a short, the protection circuit 220 may prevent the short from resulting in a current between $V_{dd}$ and $V_{ss}$ that is large enough to cause failure of the device 100.

The protection circuit 220 includes a first transistor 230 and a second transistor 240. The transistors 230, 240 are illustrated without limitation as field-effect transistors (FETs), and may be polysilicon-oxide-semiconductor FETs implemented in complementary MOS (CMOS) technology. Those skilled in the pertinent art will recognize that the principles exemplified by the various embodiments described herein may be practiced using other transistor types, e.g., bipolar transistors. The transistors 230, 240 include a controllably conductive path. For a FET the conductive path is between the source and drain when the transistor is turned on. For a bipolar transistor, the conductive path is between the emitter and the collector.

In the present embodiment, the first transistor 230 is a p-channel FET and the second transistor 240 is an n-channel FET. The decoupling capacitor has a first terminal (node "A") and a second terminal (node "B"). The drain of the first transistor 230 (node A) is conductively coupled to the gate of the second transistor 240 and to the second terminal of the decoupling capacitor 210. The drain of the second transistor 240 (node "B") is conductively coupled to the gate of the first transistor 230 and to the first terminal of the decoupling capacitor 210. The source of the first transistor 230 is connected to the $V_{dd}$ rail, while the source of the second transistor 240 is connected to the $V_{ss}$ rail. The transistors 230, 240 may be conventional, and are not limited to any particular gate width, or gate length or threshold voltage ($V_t$). In some embodiments, the transistors 230, 240 have low $V_t$ and/or minimum channel length provided by the manufacturing technology, and/or large gate widths. One or more of these features may advantageously increase conductance of the transistors 230, 240 above what it would otherwise be, providing more rapid charge/discharge of the decoupling capacitor 210.

The illustrated configuration of the transistors 230, 240 differs significantly from conventional configuration of a transistor pair. For example, in some conventional cases, a transistor pair of a same type, e.g., p-channel, may be cross-coupled such that the pair acts as a bistable storage element. In such cases, both transistors are typically tied to a single voltage rail, e.g., $V_{dd}$. In contrast to such configurations, embodiments within the scope of the disclosure include transistors of different polarity, and each transistor is connected to a different voltage rail, as illustrated in FIG. 1.

Figure 3:
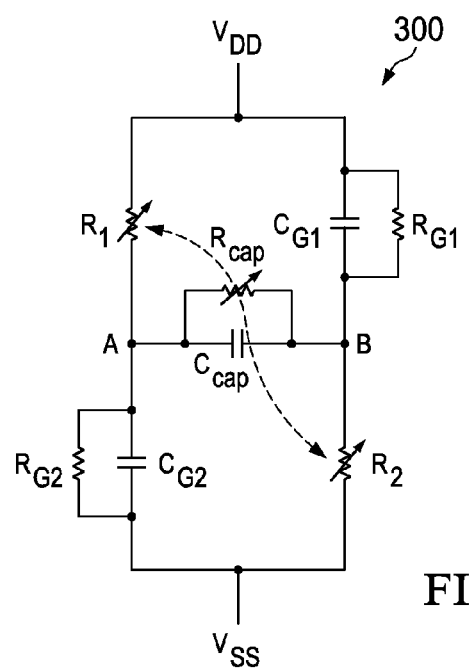
FIGS. 3-6 illustrate lumped-element circuits approximating illustrative behavior of, e.g. the protection circuit of FIG. 2 in various cases.

FIG. 3 presents a circuit 300 that illustrates a lumped-element circuit representing the protection circuit 220 and the decoupling capacitor 210. While the following description refers to aspects of FET operation, those skilled in the pertinent art are able to extend the described principles to bipolar devices.

The circuit 300 includes a variable resistor $R_1$ and capacitor $C_{G1}$ that respectively represent the conductive path (channel resistance) and gate capacitance of the first transistor 230. A resistor $R_{G1}$ represents gate leakage of the first transistor 230. The resistor $R_1$ is connected between $V_{dd}$ and node A, and the capacitor $C_{G1}$ and resistor $R_{G1}$ are connected in parallel between $V_{dd}$ and node B. A variable resistor $R_2$ and a capacitor $C_{G2}$ respectively represent the conductive path (channel resistance) and gate capacitance of the second transistor 240.

A resistor $R_{G2}$ represents the gate leakage of the second transistor 240. The resistor $R_2$ is connected between $V_{ss}$ and node B, and the capacitor $C_{G2}$ and resistor $R_{G2}$ are connected in parallel between $V_{ss}$ and node A. A capacitor $C_{cap}$ represents the reactive impedance of the decoupling capacitor 210, and is connected between node A and node B. A variable resistor $R_{cap}$ in parallel with the capacitor $C_{cap}$ represents the resistive impedance of the decoupling capacitor 210. The resistance of the variable resistors $R_1$, $R_2$ depends on the resistance value of $R_{cap}$.

Figure 4:
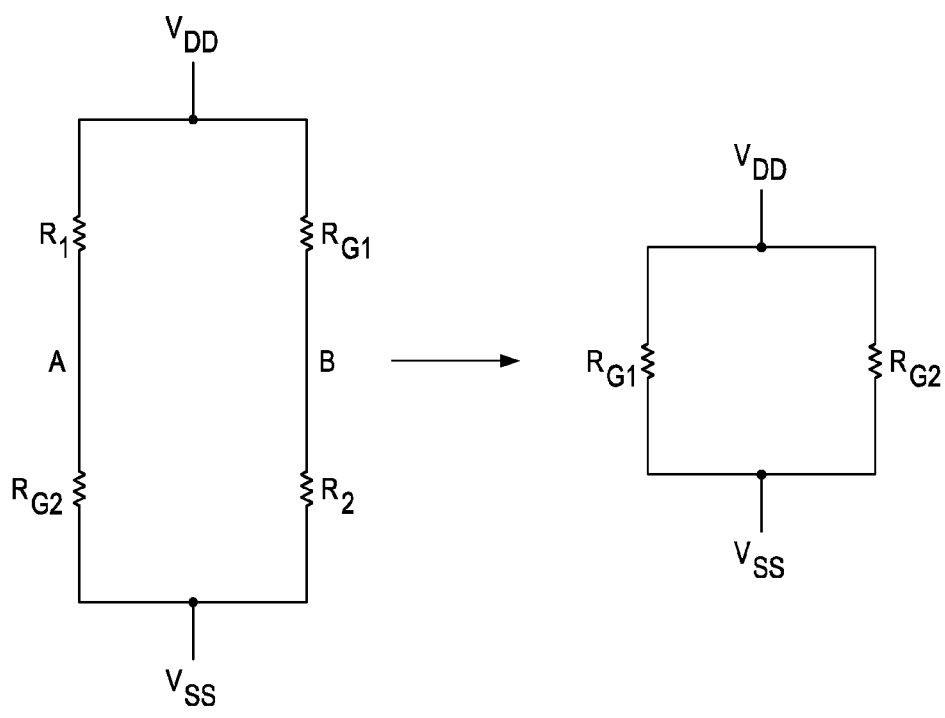

Analysis of the circuit 300 may be simplified by taking the leakage through the decoupling capacitor 210 as DC leakage. At DC, the capacitors $C_{MIM}$, $C_{G1}$ and $C_{G2}$ may be neglected. In one case, $R_{cap}$ may be modeled as having a large resistance. Herein, a large resistance may be referred to for convenience as "quasi-infinite". A quasi-infinite resistance may be, e.g., greater than 1 MΩ, and may be symbolically referred to as $R \approx \infty$. FIG. 4 illustrates an equivalent lumped-element circuit for this case. The equivalent resistance from $V_{dd}$ to $V_{ss}$, is about the parallel resistance of $(R_1+R_{G2})$ and $(R_2+R_{G1})$, e.g., $$R_{EQ} \cong (R_1+R_{G2}) \| (R_2+R_{G1}) \quad (1)$$

For a FET, the gate dielectric of the first and second transistors is typically a high quality oxide, so $R_{G1}$ and $R_{G2}$ are typically large. Thus, regardless of the value of $R_1$ and $R_2$, $R_{EQ}$ is large and the current between $V_{dd}$ and $V_{ss}$ is expected to be small.

Figure 5:
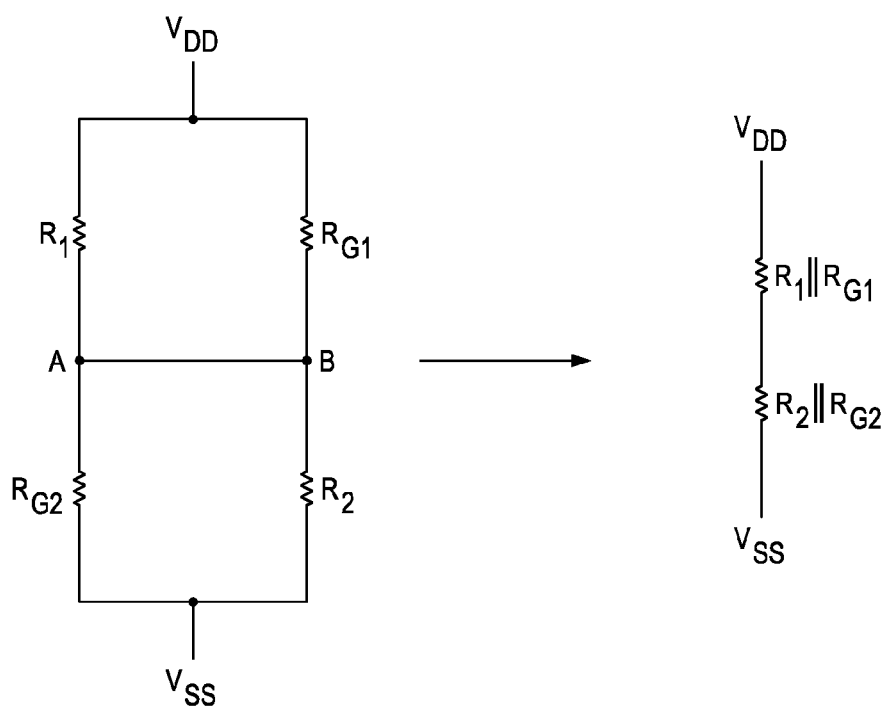

In a second case, $R_{cap}$ may be taken as a short, e.g., $R_{cap} \cong 0$. FIG. 5 illustrates an equivalent lumped-element circuit for this case. The equivalent resistance from $V_{dd}$ to $V_{ss}$ is about the series combination of $(R_1 \| R_{G2})$ and $(R_2 \| R_{G1})$, e.g., $$R_{EQ} \cong (R_1 \| R_{G1}) + (r_2 \| R_{G2}) \quad (2)$$

The transistors 230, 240 are expected to both be in an off state when node A is shorted to node B, so $R_1$ and $R_2$ are expected to be large. As described above, $R_{G1}$ and $R_{G2}$ are typically large, so $R_{EQ}$ is again expected to be large and the current between $V_{dd}$ and $V_{ss}$ is expected to be small.

Figure 6:
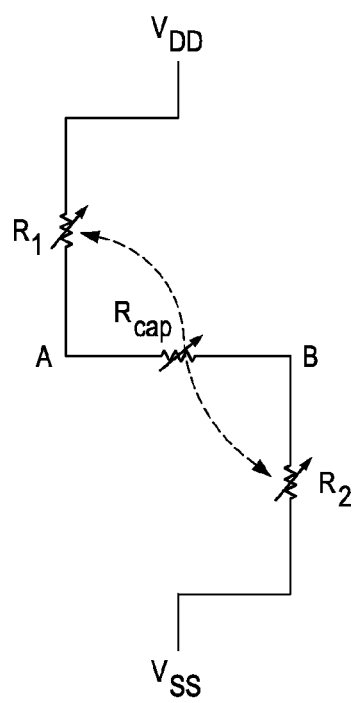

Now considering a third case, the resistance of $R_{cap}$, may be an intermediate value between a short and an open. FIG. 6 illustrates a lumped-element circuit representing this case. In general the transistors 230, 240 will both be on to some degree, so the $R_1$ and $R_2$ will not in general be large. The degree to which the transistors 230, 240 conduct is expected to be determined in part by the value of the resistance $R_{cap}$. The resistance between $V_{dd}$ and $V_{ss}$ is expected to be about the series combination of $R_1$, $R_{cap}$ and $R_2$, e.g., $$R_{EQ} + \cong R_1 + R_2 \quad (2)$$

The current between $V_{dd}$ and $V_{ss}$ is expected to be larger than the first and second cases described for some value of $R_{cap}$ between zero and ∞. Typically the current is expected to have a maximum value.

FIG. 7 illustrates an example calculated I-R characteristic 700 representative of the decoupling circuit 200 of FIG. 2. The vertical axis of the characteristic 700 represents the current $I_{leak}$ between $V_{dd}$ and $V_{ss}$ through the decoupling circuit 200. The horizontal axis represents the value of $R_{cap}$ from zero to a quasi-infinite resistance. The calculation uses transistor parameter values for the transistors 230, 240 consistent with a minimum channel length of a representative CMOS process technology. Such technologies often provide an option for a higher-$V_t$ and a lower-$V_t$. The characteristic 700 represents the case of a higher-$V_t$, while FIG. 8 below illustrates the case of a lower-$V_t$.

In FIG. 7, a value 710 represents the equivalent resistance of the decoupling circuit 200 for the case that $R_{cap}=0$. A value 720 represents the equivalent resistance between the $V_{dd}$ and $V_{ss}$ terminals of the decoupling circuit 200 for the case that $R_{cap} \approx \infty$. Between the values 710, 720 is a value 730 at which the current between $V_{dd}$ and $V_{ss}$ reaches a maximum value.

There are several characteristics of the I-R characteristic 700 noted here. First, the current through the decoupling circuit 200 is about the same when the decoupling capacitor 210 is shorted and when the decoupling capacitor 210 has a quasi-infinite resistance. Second, while the current reaches a maximum value for some value of the resistance, the maximum current is less than an order of magnitude greater than the current at $R_{cap}=0$ and $R_{cap} \approx \infty$. This value is expected to be low enough that the device 100 is still expected to operate even when a modest number of decoupling capacitors 210 have a resistance that results in the maximum current.

Following the graph in FIG. 7, with continuing reference to FIG. 2, when the value of the $R_{cap}$ is large, $I_{leak}$ is determined by the leakage (gate leakage, e.g.) of the transistors 230, 240. As the value of $R_{cap}$ gets smaller, $I_{leak}$ rises. However, below a certain value, $I_{leak}$ decreases as the transistors 230, 240 start to shut off. When there is a perfect short (R=0) between the plates of the decoupling capacitor 210, the conductance of the transistors 230, 240 is low and the leakage is largely determined by subthreshold leakage of the transistors 230, 240. The characteristic 700 is expected to depend on the length 'L' and width 'W' of the transistors 230, 240 devices as well as their threshold voltages $V_t$. As the $V_t$ of the devices is reduced, it is expected that $I_{leak}$ at R=0 will be higher. On the other hand, when $R_{cap} \approx \infty$, $I_{leak}$ is not thought to be influenced by the $V_t$. Without limitation by theory, this is thought to be due to the nature of the overall leakage path which comprises leakage from the gate to the source and drain of the transistors 230, 230. This leakage is expected to be relatively insensitive to $V_t$.

To illustrate this point, FIG. 8 shows a characteristic 800 similar to that of the characteristic 700. The calculation for the characteristic 800 again uses parameter values consistent with transistors 230, 240 having a minimum channel length for the same representative CMOS process technology as the characteristic 700, but with a lower-$V_t$. As before, a value 810 represents the equivalent resistance of the decoupling circuit 200 for the case that $R_{cap}=0$. A value 820 represents the resistance of the equivalent decoupling circuit 200 for the case that $R_{cap} \approx \infty$. Between the values 810, 820 is a value 830 at which the current between $V_{dd}$ and $V_{ss}$ reaches a maximum value.

Comparing the characteristics 700, 800 the current at 810 (R=0, lower-$V_t$) is somewhat higher than the current at 710 (R=0, higher-$V_t$), and the maximum current at 830 (lower-$V_t$) is significantly greater than the current 730 (higher-$V_t$). In contrast, the currents at 720, 820 ($R_{cap} \approx \infty$) are almost the same. As $R_{cap}$ increases, the characteristics 700, 800 converge, becoming essentially indistinguishable as $R_{cap} \to \infty$. Thus, when $R_{cap}$ is large enough the leakage current through the decoupling circuit 200 is nearly independent of the $V_t$ of the transistors used to implement the protection decoupling circuit 200.

In some cases the presence of the series resistance provided by the transistors 230, 240 between $V_{dd}$ and $V_{ss}$, may decrease the effectiveness of the decoupling capacitor 210 to provide the necessary charge to reduce power supply noise in decoupling applications by, e.g., increasing RC delay. However, in any a typical system, parasitic resistances similar to the resistance provided by the transistors 230, 240 exist in the form of gate leakage in various circuits, as well as leakage from metal traces through dielectric layers within the power delivery network. In many cases, it may be advantageous to carefully evaluate the design of the decoupling circuit 200 through simulation and sound engineering judgment in the context of the desired size of the decoupling capacitor 210. In some embodiments it may be preferable to implement the transistors 230, 240 with lower-$V_t$ devices where the process technology provides the option, in view of 1) the observation that the lower-$V_t$ transistors may offer a lower series resistance than the higher-$V_t$ transistors, and 2) due to the fact that the $V_{dd}$-to-$V_{ss}$ current ($I_{leak}$ at large values of shorting resistance ($R_{cap} \approx \infty$) is relatively insensitive to $V_t$.

Turning to FIG. 9, a circuit 900 illustrates an embodiment in which a first protection circuit 910 and a second protection circuit 920 are configured to protect a capacitor array 930. The protection circuits 910, 920 and the capacitor array 930 cooperate to filter power supply noise on the $V_{dd}$ and $V_{ss}$ power supply rails.

FIG. 10A illustrates embodiments of a physical layout of a linear capacitor array 1010 functionally similar to the circuit 900. FIG. 10B illustrates multiple arrays 1010 arranged to form an illustrative consolidated decoupling circuit 140. The array 1010 includes a number of decoupling capacitors 1020 connected in parallel by a top-plate bus 1030 and a bottom-plate bus 1040. In various embodiments the top-plate bus 1030 and the bottom-plate bus 1040 are implemented in the first metal interconnect level above the substrate 110, e.g., metal 1. The decoupling capacitors 1020 may be, e.g., MiM capacitors as described previously. One protection circuit 1050 is located at each end of the array of decoupling capacitors 1020. Vias 1060 connect the protection circuit 1050 to the top-plate bus 1030, while vias 1070 connect the protection circuit 1050 to the bottom-plate bus 1040. A top-plate contact 1080 provides an electrical connection from the top-plate bus 1030 to a top-plate layer (e.g. metal 3) of the decoupling capacitors 1020 and a bottom-plate contact 1090 provides connections from the bottom-plate bus 1040 to a bottom-plate layer of the decoupling capacitors 1020 (e.g. metal 2).

The protection circuits 1050 are configured to protect the $V_{dd}$ and $V_{ss}$ power rails from the presence of a low-resistance connection between the top-plate bus 1030 and the bottom-plate bus 1040 in the event that one of the decoupling capacitors 1020 has a low resistance connection between terminals thereof. The presence of two protection circuits 1050 is expected to advantageously reduce resistance from the plates of the decoupling capacitors 1020 to the power supply rails protected by the array 1010. In various embodiments, multiple protection circuits 1050 are configured in parallel as needed to provide a desirably low between the $V_{dd}$ and $V_{ss}$ power rails and the decoupling capacitors 1020. In practice, the benefit of additional protection circuits 1050 comes at the expense of additional area consumed on the device 100, and may result in additional leakage between $V_{dd}$ and $V_{ss}$.

In contrast to some conventional implementations of decoupling capacitors, the array 1010 provides a relatively small number of decoupling capacitors 1020, e.g., less than about 10, connected in parallel with the conductive paths of transistors such as the transistors 230, 240 located within the protection circuits 1050. One advantage of this configuration is that resistance from the protection circuits to the decoupling capacitors 1020 is limited, thereby limiting RC delay that may reduce the effectiveness of the decoupling capacitors 1020. Moreover, if a decoupling capacitor 1020 within the array 1010 is shorted after fabrication or later fails, the benefit provided by the array 1010 may be lost. Because only a relatively small number of capacitors are present in the array 1010, the reduction of protection of the power supply rails from power-noise is relatively small compared to the overall protection from power-noise provided by remaining arrays 1010. The small size of the protection circuits 1050 resulting from the use of only two transistors allows a low ratio of the number of decoupling capacitors 1020 to the number of protection circuits 1050 on the device 100.

FIG. 10B illustrates without limitation multiple instances of the linear array 1010 grouped together in a compact arrangement to form the consolidated decoupling circuit 140 described previously. The decoupling circuit 140 may be advantageously placed in available white space in the device 100, as illustrated in FIG. 1. Of course, individual decoupling circuits 130, or smaller groups than illustrated in FIG. 10B, may be placed in a device 100 design as needed and as space permits to provide localized power rail decoupling. The protection circuit 220 may be located with such capacitors to provide protection against capacitors shorts.

In some embodiments, banks of decoupling capacitors such as the decoupling capacitors 210 may be used in a device 100 design where some banks are protected by the protection circuit 220 and some are left unprotected. The latter class of decoupling capacitors 210 may be useful in cases where for very sharp switching currents, the direct connection of the capacitors to power/ground may be more effective. Any combination of protected and unprotected capacitors may be used as desired.

In some embodiments, the top-plate bus 1030 or the bottom-plate bus 1040 may be configured in common with two or more linear arrays 1010 or decoupling circuits 140 and still retain all the advantages of the protection circuitry. Such embodiments provide the potential to simplify layout and reduce area of the physical design.

Turning to FIG. 11, presented is an illustrative method 1100 of manufacturing an electronic device. The method begins with a step 1110, in which an electronic device substrate is provided. Herein and in the claims, "provided" means that a device, substrate, structural element, etc., may be manufactured by the individual or business entity performing the disclosed methods, or obtained thereby from a source other than the individual or entity, including another individual or business entity.

In a step 1120, active circuitry is formed over the substrate. In a step 1130, the active circuitry is configured to be powered by a first power supply rail and a second power supply rail, e.g., $V_{dd}$ and $V_{ss}$. In a step 1140, a decoupling capacitor is located over the substrate to reduce power supply noise on the first and second power supply rails. For example, one terminal of the capacitor may be connected such that the capacitor may act as a short-duration charge source or sink to reduce switching noise on the power supply rails.

In a step 1150, a protection circuit is located over the substrate and configured to limit a current through the decoupling capacitor. The protection circuit may be, e.g., the protection circuit 220 employing FET or bipolar transistors. The protection circuit includes a first transistor having a first conduction path. One terminal of the first conduction path is connected to a first terminal of the capacitor, and another terminal of the first conduction path is connected to the first power supply rail. A second transistor has a second conduction path. One terminal of the second conduction path is connected to a second terminal of the capacitor, and another terminal of the second conduction path is connected to the second power supply rail. Where FET transistors are used, any combination of gate length and width, and $V_t$ may be used for transistors making up the protection circuit.

Those skilled in the art to which this application relates will appreciate that other and further additions, deletions, substitutions and modifications may be made to the described embodiments.

What is claimed is:

1. An integrated circuit power supply decoupling circuit, comprising:
    a capacitor having a first terminal and a second terminal; and
    a protection circuit comprising:
        a first transistor having a first conduction path and a first control terminal for controlling said first conduction path, one terminal of said first conduction path being connected to said first terminal, another terminal of said first conduction path being connected to a first power supply rail and said first control terminal being connected to said second terminal; and
        a second transistor having a second conduction path and a second control terminal for controlling said second conduction path, one terminal of said second conduction path being connected to said second terminal, another terminal of said second conduction path being connected to a different second power supply rail and said second control terminal being connected to said first terminal.

2. The decoupling circuit as recited in claim 1, wherein said capacitor is a first capacitor, and further comprising a second capacitor connected to said first and said second conduction paths in parallel with said first capacitor.

3. The decoupling circuit as recited in claim 1, wherein said first transistor is a p-channel FET having a first source, a first gate and a first drain, and said second transistor is an n-channel FET having a second source, a second gate and a second drain, and said first gate is conductively coupled to said second drain and said second terminal of said capacitor, and said second gate is conductively coupled to said first drain and said first terminal of said capacitor.

4. The decoupling circuit as recited in claim 1, wherein said first and said second power supply rails are power supply rails of an integrated circuit comprising higher-$V_t$ FETs and lower-$V_t$ FETs, and said first and second transistors are lower-$V_t$ FETS.

5. The decoupling circuit as recited in claim 1, wherein said capacitor is one of a linear array of a plurality of capacitors connected in parallel, and said protection circuit is a first protection circuit located at a first end of said linear array, and further comprising a second protection circuit located at a second end of said linear array.

6. The decoupling circuit as recited in claim 1, wherein said first and said second transistors are bipolar transistors.

7. The decoupling circuit as recited in claim 1, wherein a current between said first and second power supply rails through said protection circuit has an associated current characteristic that exhibits a local maximum between a low resistance of said capacitor and a high resistance of said capacitor.

8. An integrated circuit, comprising:
    a device substrate;
    active circuitry located over said substrate and configured to be powered by a first power supply rail and a second power supply rail;
    a capacitor having a first terminal and a second terminal, being configured to reduce power supply noise on said first and second power supply rails; and
    a protection circuit configured to limit a current through said capacitor, comprising:
        a first transistor having a first conduction path and a first control terminal for controlling said first conduction path, one terminal of said first conduction path being connected to said first terminal, another terminal of said first conduction path being connected to said first power supply rail and said first control terminal being connected to said second terminal; and a second transistor having a second conduction path and a second control terminal for controlling said second conduction path, one terminal of said second conduction path being connected to said second terminal, another terminal of said second conduction path being connected to said second power supply rail and said second control terminal being connected to said first terminal.

9. The integrated circuit as recited in claim 8, wherein said capacitor is a first capacitor, and further comprising a second capacitor connected to said first and said second conduction paths in parallel with said first capacitor.

10. The integrated circuit as recited in claim 8, wherein said first transistor is a p-channel FET having a first source, a first gate and a first drain, and said second transistor is an n-channel FET having a second source, a second gate and a second drain, and said first gate is conductively coupled to said second drain and said second terminal of said capacitor, and said second gate is conductively coupled to said first drain and said first terminal of said capacitor.

11. The integrated circuit as recited in claim 8, further comprising higher-$V_t$ FETs and lower-$V_t$ FETs, wherein said first and second transistors are lower-$V_t$ FETS.

12. The integrated circuit as recited in claim 8, wherein said capacitor is one of a linear array of a plurality of capacitors connected in parallel, and said protection circuit is a first protection circuit located at a first end of said linear array, and further comprising a second protection circuit located at a second end of said linear array.

13. The integrated circuit as recited in claim 8, wherein said first and said second transistors are bipolar transistors.

14. The integrated circuit as recited in claim 8, wherein a current between said first and second power supply rails through said protection circuit has an associated current characteristic that exhibits a local maximum between a low resistance of said capacitor and a high resistance of said capacitor.

15. A method of manufacturing an integrated circuit, comprising:
providing a substrate;
forming active circuitry over said substrate;
configuring said active circuitry to be powered by a first power supply rail and a second power supply rail;
configuring a decoupling capacitor located over said substrate to filter power supply noise on said first and second power supply rails; and
locating over said substrate a protection circuit configured to limit a current through said capacitor, said protection circuit comprising:
a first transistor having a first conduction path and a first control terminal for controlling said first conduction path, one terminal of said first conduction path being connected to a first terminal of said capacitor, another terminal of said first conduction path being connected to said first power supply rail and said first control terminal being connected to said second terminal; and
a second transistor having a second conduction path and a second control terminal for controlling said second conduction path, one terminal of said second conduction path being connected to a second terminal of said capacitor, another terminal of said second conduction path being connected to said second power supply rail and said second control terminal being connected to said first terminal.

16. The method as recited in claim 15, wherein said capacitor is a first capacitor, and further comprising connecting a second capacitor to said first and said second conduction paths in parallel with said first capacitor.

17. The method as recited in claim 15, wherein said first transistor is a p-channel FET having a first source, a first gate and a first drain, and said second transistor is an n-channel FET having a second source, a second gate and a second drain, and said first gate is conductively coupled to said second drain and said second terminal of said capacitor, and said second gate is conductively coupled to said first drain and said first terminal of said capacitor.

18. The method as recited in claim 15, wherein said active circuitry comprises higher-$V_t$ FETs and lower-$V_t$ FETs, and wherein said first and second transistors are lower-$V_t$ FETS.

19. The method as recited in claim 15, further comprising connecting a plurality of capacitors in parallel with said decoupling capacitor, said protection circuit being a first protection circuit located at a first end of said linear array, further comprising connecting a second protection circuit to another end of said linear array.

20. The method as recited in claim 15, wherein said first and said second transistors are bipolar transistors.

* * * * *